United States Patent [19]

Epsztein

[11] 4,439,746

[45] Mar. 27, 1984

[54] EXTENDED INTERACTION MICROWAVE OSCILLATOR INCLUDING A SUCESSION OF VANES WITH ORIFICES

[75] Inventor: Bernard Epsztein, Paris, France

[73] Assignee: Thomson-CSF, Paris, France

[21] Appl. No.: 265,375

[22] Filed: May 20, 1981

[30] Foreign Application Priority Data

May 23, 1980 [FR] France ................................ 80 11552

[51] Int. Cl.$^3$ .......................... H01J 25/36; H03B 9/08

[52] U.S. Cl. ........................................ 331/82; 315/3.5; 315/39.3

[58] Field of Search ............... 331/79, 81, 82; 315/39, 315/39.3, 3.5; 333/228, 157

[56] References Cited

U.S. PATENT DOCUMENTS

| | | | |
|---|---|---|---|
| 2,411,953 | 12/1946 | Brown | 315/39.53 |
| 2,552,334 | 5/1951 | Linder | 315/5.14 |
| 2,951,182 | 8/1960 | Feinstein | 315/39.53 |
| 3,535,584 | 10/1970 | Cutting | 315/39.3 |

FOREIGN PATENT DOCUMENTS

| | | |
|---|---|---|
| A987573 | 4/1951 | France . |
| 1050701 | 9/1953 | France . |
| 1173546 | 10/1958 | France . |
| 1472704 | 1/1967 | France . |
| 1578600 | 7/1969 | France . |

OTHER PUBLICATIONS

Ire Transactions on Electron Devices, vol. Ed–6, No. 1, Jan. 1959 NY J. Feinstein et al, "A Class of Waveguide-Coupled Slow-Wave Structures", pp. 9–17.

Ire Transactions on Electron Devices, vol. Ed–9, No. 2, Mar. 1962, NY. J. W. Sewartowski, "Waveguide-Vane Coupled Slow-Wave Structure Suitable for High-–Power Traveling-Wave Amplifier," pp. 204–209.

The Microwave Journal, vol. 2, No. 12, Dec. 1959, Horizon House, Nedham E. J. Nalos, "Present State of Art on High-Power Traveling-Wave Tubes" pp. 31–38.

*Primary Examiner*—Siegfried H. Grimm
*Attorney, Agent, or Firm*—Roland Plottel

[57] ABSTRACT

This oscillator comprises a periodic structure line constituted by a succession of vanes having an orifice in which propagates a linear electron beam. This line is placed over a cavity constituted by a straight parallelepiped which has a rectangular base, whose dimensions are determined in such a way that it behaves like a waveguide at the cut-off frequency, along the longitudinal axis of the line and on a transverse magnetic or $TM_{mn}$ mode with m=1, 3, 5 etc. and n=1, 2, 3, 4 etc. Coupling slots are provided on the cavity between two successive vanes and in a gap between pairs of vanes. The anode voltage of the beam and the distance between two successive vanes are selected in such a way that the cavity resonates at the cut-off frequency and on the $\pi$ mode. Applications include measuring oscillators and heterodyne radar transmitters and receivers.

13 Claims, 3 Drawing Figures

EXTENDED INTERACTION MICROWAVE OSCILLATOR INCLUDING A SUCESSION OF VANES WITH ORIFICES

BACKGROUND OF THE INVENTION

The present invention relates to an extended interaction microwave oscillator.

Such extended interaction oscillators are well known from the prior art.

These oscillators are particularly used towards millimetric wavelengths as measuring oscillators or heterodyne radar transmitters and receivers. They comprise a relatively short line section with a periodic structure, being in general only constituted by about 10 identical stages. This line generally comprises a succession of metal bars and slots or a sequence of identical or non-identical metal vanes (rising sun-type structure). This line section is contained in a vacuum-tight case.

A linear electron beam passes through the line or lightly touches it, whilst an extremely high frequency wave is produced which is propagated in the case. Interaction takes place between wave and beam and the line-case assembly resonates. Oscillation generally takes place on the $\pi$ mode.

The prior art extended interaction oscillators have the following disadvantages. The mechanical tolerances for the periodic structure line are very strict. In fact it can be considered that the extended interaction oscillator comprises a sequence of resonant cavities. It is very important that these cavities have precisely the same geometrical structure, particularly to prevent spurious oscillations making very strict mechanical tolerances necessary, particularly for the line. Extended interaction oscillators can be mechanically tuned in a relatively small frequency band. The various oscillation modes are very close to one another and random mode jumps occur. Thus, the quality of the frequency spectrum produced is not very good and this deteriorates as the overvoltage decreases. Due to this low overvoltage the losses are significant and the efficiency relatively poor.

BRIEF SUMMARY OF THE INVENTION

The present invention relates to an extended interaction oscillator which does not have these disadvantages.

The extended interaction oscillator according to the invention comprises a periodic structure line constituted by a succession of vanes, which are traversed or lightly touched by a linear electron beam. This line is placed over a linear cavity, whose dimensions are determined in such a way that it behaves like a wave guide at the cut-off frequency in accordance with the longitudinal axis of the line and on a transverse magnetic or $TM_{mn}$ mode with $m=1, 3, 5 \ldots$ and $n=1, 2, 3, 4$ etc. Coupling orifices between the vanes and the cavities are provided on the cavity between two successive vanes and at regular intervals. The anode voltage of the beam, the distances between two successive vanes and between two successive coupling orifices are fixed as a function of the selected oscillation frequency for the oscillator, which is equal to the cut-off frequency of the cavity. Finally a coupling device makes it possible to tap the oscillator output energy from the cavity.

The following are the main advantages of the oscillator according to the invention. The mechanical tolerances regarding the dimensions of the line vanes are no longer critical as in the case of the prior art oscillator delay line. However, the mechanical tolerances regarding the dimensions of the cavity, which is provided with coupling orifices are relatively strict, but this causes less problems than in the case of vanes. A large mechanical tuning range can be obtained, particularly in the case of oscillator constructions where the cavity is a parallelepiped. Finally a single very high overvoltage resonance is obtained, so that the oscillation has a very high spectral purity. Thus, there are no random mode jumps and the efficiency is excellent.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

In the various drawings the same references designate the same elements, but, for reasons of clarity, the dimensions and proportions of the various elements are not respected.

Figure 1:
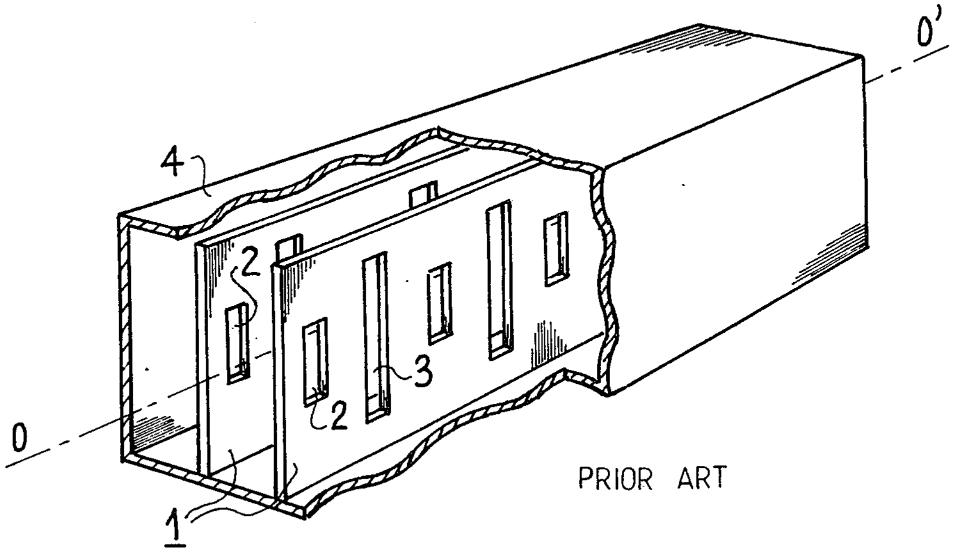
FIG. 1 a perspective view of an extended interaction oscillator according to the prior art.

FIG. 1 relates to a perspective view of a prior art extended interaction oscillator. This oscillator comprises a delay line 1, which is constituted by two identical facing metal plates. Each of these plates has at regular intervals a succession of two types of slots having unequal lengths, namely a small slot 2 and a large slot 3. The slots with the same name of the two plates face one another. Thus, it is a question of a delay line 1 comprising a succession of metal bars and slots.

This delay line 1 is housed within a vacuumtight case 4.

A linear electron beam is produced by an electron gun, which is not shown in the drawing and which is located at one end of case 4. This electron beam is propagated between the two plates constituting the delay line 1 in accordance with an axis 00', which is the longitudinal axis of case 4. At the other end of case 4 the electron beam is collected on a collector, which is not shown. Finally, a not shown magnetic focusing mechanism formed in per se known manner by a solenoid or permanent magnet guides the electron beam along axis 00'.

Figure 2:
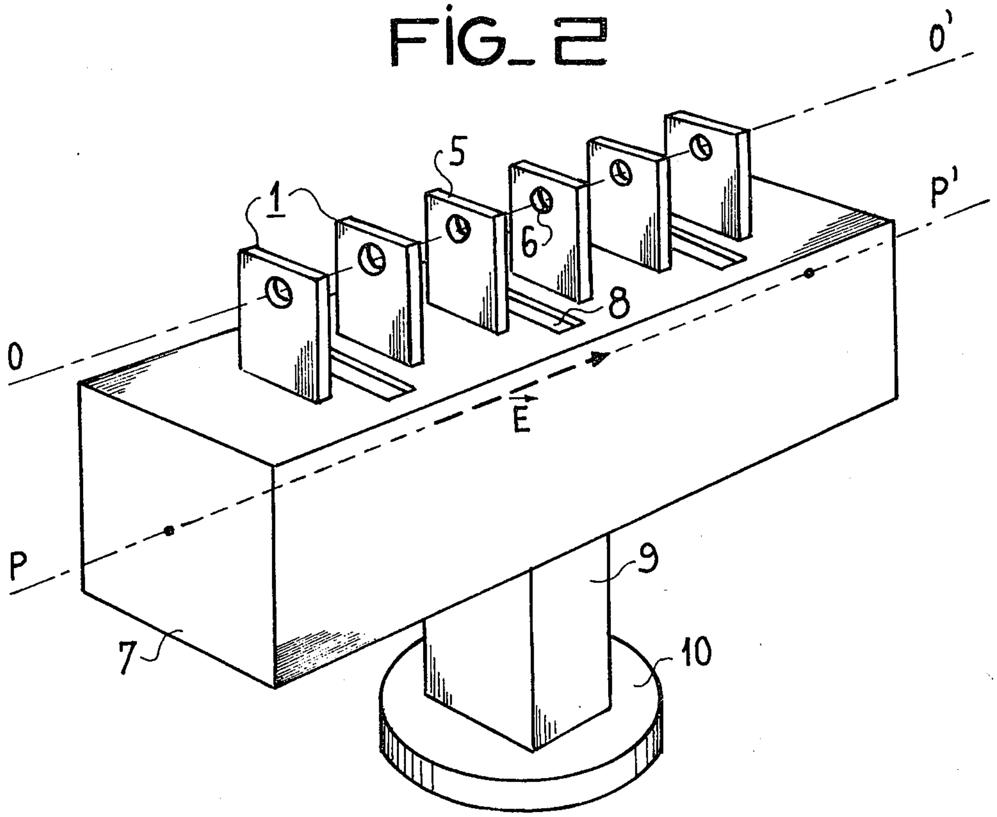
FIG. 2 a perspective view of an embodiment of an extended interaction oscillator according to the invention.
Figure 3:
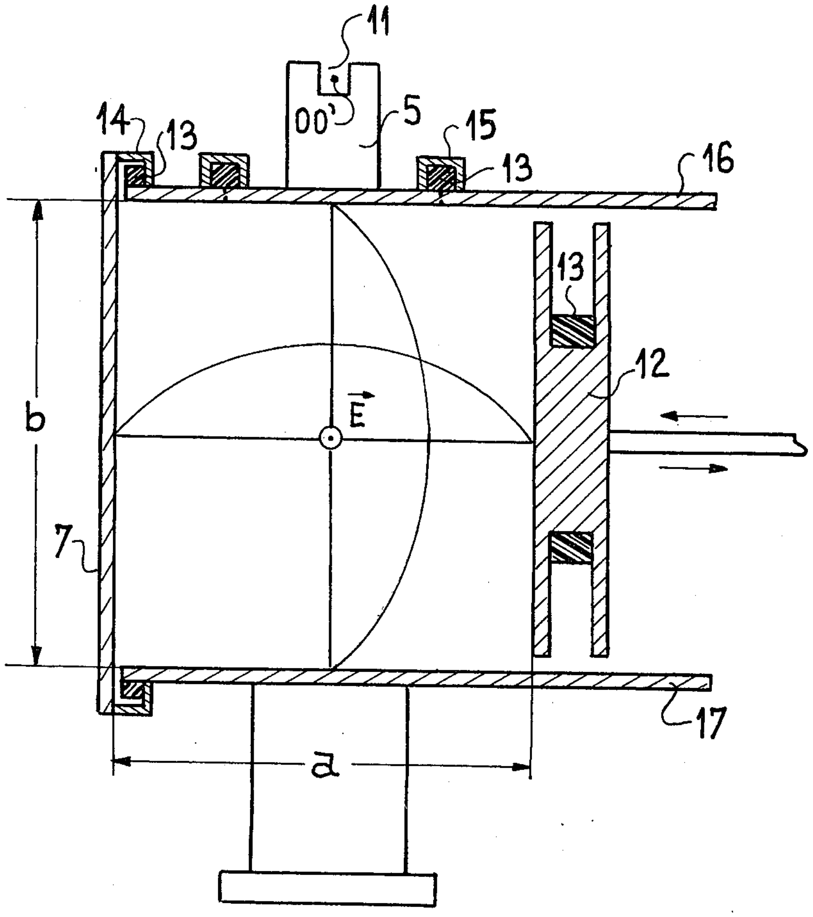
FIG. 3 a cross-sectional view of another embodiment of an extended interaction oscillator according to the invention.

FIG. 2 is a perspective view of an embodiment of an extended interaction oscillator according to the invention. FIG. 3 is a cross-sectional view of another embodiment of the oscillator according to the invention. The extended enteraction oscillator (I.E.O.) according to the invention comprises a periodic structure line 1, which is constituted by a succession of vanes 5 at regular intervals. Each vane has an orifice 6, like that shown in FIG. 2, or has a slot 11, like that shown in FIG. 3. A linear electron beam is propagated along axis 00' through these orifices or slots and passes through the centre of said orifices or slots. This electron beam is emitted by an electron gun focused along axis 00' by a magnetic focusing mechanism and is finally received by a collector. All these components, i.e. the gun, focusing mechanism and collector are well known in the art and are not shown in the drawings.

The electron beam may also be a flat beam which lightly touches the upper edge of vanes 5, which then have neither orifice nor slot.

Line 1 is placed over a linear cavity 7, which is almost entirely closed. The section of this cavity can have random shapes, e.g. circular. However, the cavity is most frequently formed by a straight parallelepiped, whose section is a rectangle or square. This is the case in FIG. 3 where the section of the cavity has dimensions a along the horizontal line and b along the vertical line.

The dimensions of the cavity are defined in such a way that it behaves like a waveguide at the cut-off frequency along longitudinal axis 00' of the line and on a transverse magnetic or $TM_{mn}$ mode with m=1, 3, 5 . . . and n=1, 2, 3, 4 . . .

By limiting to $TM_{mn}$ modes with m=1,3,5 . . . and n=1, 2, 3, 4 etc. the modes for which the electrical field is at a maximum are selected in accordance with the median plane of the cavity containing the axis 00'. It is pointed out that m and n correspond to the number of half-periods of the electrical field in accordance with dimensions a and b of the guide in the case of a rectangular guide. By selecting m uneven a maximum field is therefore obtained in the median plane with respect to the field in accordance with dimension a. With regard to the field in dimension b the fact that n is even or uneven has no effect on the value of the field in the indicated median plane.

In FIG. 3 m and n are equal to 1 and the variations of the electrical field in the cross-section are represented in fine line form.

The oscillator according to the invention has coupling orifices 8 between the vanes and the cavity. These orifices are in the form of slots made on the cavity between two successive vanes and at regular intervals. In FIG. 2 there is a coupling slot 8 in a gap between each pair of vanes.

A coupling device makes it possible to tap the oscillator output energy. The device can comprise a rectangular guide 9 connected to the cavity via an iris and extended by a flange 10.

Finally it is obvious that the oscillator of FIG. 2 is housed in a vacuum-tight case, which is not shown.

The operation of the oscillator according to the invention will now be considered. It operates in a similar manner to a coaxial magnetron.

It is pointed out that the cavity behaves like a waveguide at the cut-off frequency along axis $\overrightarrow{00'}$ and on a $TM_{mn}$ mode, so that the electrical field $\vec{E}$ within the cavity is invariant along the longitudinal axis PP' of the cavity, which is parallel to 00'. The electrical field $\vec{E}$ is symbolically shown in FIG. 2 by means of a broken line arrow on axis PP'. Thus, the coupling orifices 8 are excited in phase by the electrical field $\vec{E}$.

In the case of FIG. 2 where there is a coupling orifice 8 in a gap between pairs of valves it is possible to function on modes $\pi$ or $3\pi$. Beyond this, i.e. for modes $5\pi$, $7\pi$ etc. the oscillator impedence is no longer acceptable, so that there is no extension beyond mode $3\pi$.

It is pointed out that for the mode $\pi$ the electrical field is phase-shifted by $\pi$ from one vane to the next, whilst the phase shift is $3\pi$ for mode $3\pi$.

In order to function in the $\pi$ mode, which is that which is most frequently used, in the case of FIG. 2 the anode voltage determining the velocity of the electron beam and the distance between two successive vanes are selected in such a way that the transit time of the electron beam from one coupling orifice to the next is close to the period of the electrical field, whose wavelength is $\lambda_C$.

Thus, there is a phase shift of $\pi$ on the electrical field from one vane to the next.

Thus, the electron beam is retarded by the electrical field to which it transfers energy at the coupling orifices, whilst producing useful extremely high frequency energy and whilst maintaining oscillation.

Thus, resonant conditions are produced in the cavity at the cut-off frequency of the waveguide to which the cavity can be likened.

In FIG. 2 it is also possible to function in the $3\pi$ mode. The transit time of the electron beam from one coupling orifice to the next must then be close to three times the period of the electrical field, whose wavelength is $\lambda_C$ and the anode voltage must be modified.

It is also possible to function on the $2\pi$ mode by providing a coupling orifice 8 in each gap between the vanes. The transit time of the electron beam from one coupling orifice to the next must then be close to the period of the electrical field.

It can therefore be seen that the oscillation frequency of the oscillator according to the invention is the cut-off frequency of the waveguide to which can be likened the cavity 7 having coupling orifices 8. It is therefore the dimensions of the cavity which are important for fixing the oscillation frequency and not the dimensions of the vanes, as is the case with the prior art oscillator.

Therefore a very wide mechanical tuning range for the oscillation frequency can be obtained very easily, particularly in the oscillator embodiments where the cavity is a straight parallelepiped.

Thus, in the case of a rectangular waveguide the dimensions a and b of the guide cross-section are linked with m and n and with the cut-off wavelength $\lambda_C$ by the equation:

$$\left(\frac{m}{2a}\right)^2+\left(\frac{n}{2b}\right)^2=\frac{1}{\lambda_C^2} \quad (1)$$

By varying a or b (cf. FIG. 3) a mechanical adjustment of the oscillation frequency is obtained.

The variations of the electrical field shown in FIG. 3 by fine lines are not modified because the amplitude of the field related to horizontal and vertical axes, whose origin is located on the axis PP', is written:

$$E=E_o\cdot\cos\frac{\pi x}{a}\cdot\cos\frac{\pi y}{b}$$

in which $E_o$ is a constant.

FIG. 3 diagrammatically shows how it is possible to vary the horizontal dimension a of the base of the cavity constituted by a straight parallelepiped by using a vertical piston 12. It is also possible to vary dimension b of the cavity.

The electrical field $\vec{E}$ in the cavity and the current lines in its side walls are perpendicular to the plane of FIG. 3. It is not therefore useful for piston 12 to be in contact with the side walls 16, 17 of the cavity. However, the piston must be in contact with the vertical walls closing the cavity and which are perpendicular to the axis PP', because current lines traverse said walls.

Moreover, due to this special distribution of the current lines, it is possible to eliminate all the interfering modes. A distinction can essentially be made between two types of interfering mode. The first type is the cavity modes in the form of TE and TM modes having a longitudinal variation, i.e. $TM_{mnp}$ modes with $p \neq 0$. All these modes have transverse current components. It is therefore easy to attenuate them by placing an attenuating substance 13 protected by a metal mask 14 level with the longitudinal edges of the cavity and in the manner shown for the two edges in FIG. 3. Thus, in $TM_{mno}$ modes used in the oscillator according to the invention, even the longitudinal component of the current is zero on these edges. The attenuating substance 13 can also be provided in the thickness of the mobile piston. The second type comprises modes due to the coupling orifices. The slots 8 which constitute the coupling orifices have resonant frequencies which are attenuated by placing an attenuating substance 13 protected by a metal mask 15 at the ends of said slots on either side of the vanes.

Finally the attenuating substance can be placed within the vacuum-tight case housing the oscillator in order to damp the interfering modes which could propagate therein.

This elimination of interfering modes makes it possible to obtain a single resonance with a very high overvoltage and a high spectral purity of the oscillation. Thus, the random mode jumps are substantially nonexistent and the efficiency excellent.

What is claimed is:

1. An extended interaction microwave oscillator comprising a periodic structure line constituted by a succession of vanes, which are traversed or lightly touched by a linear electron beam, wherein said line is placed over a linear cavity whose dimensions are determined in such a way that it behaves like a waveguide at the cut-off frequency, along the longitudinal axis of the line and on a transverse magnetic mode, $TM_{mn}$ with $m=1, 3, 5$ etc. and $n=1, 2, 3, 4$ etc., coupling orifices are provided in the wall of the cavity between two successive vanes and at regular intervals, the anode voltage of the beam, the distances between two successive vanes and between two successive orifices being fixed as a function of the selected oscillation frequency for the oscillator, which is equal to the cut-off frequency of the cavity and finally a coupling device connected to the cavity makes it possible to tap the oscillator output energy of the cavity.

2. An oscillator according to claim 1 wherein oscillation takes place on the $\pi$ mode and wherein the distance between two successive coupling orifices is double that between two successive vanes.

3. An oscillator according to claim 1 wherein oscillation takes place on the $2\pi$ mode and wherein the distance between two successive coupling orifices is equal to that between two successive vanes.

4. An oscillator according to claim 1, wherein the cavity is a straight parallelepiped, having a longitudinal axis PP' in parallel with the longitudinal axis of said periodic structure line, and a cross section perpendicular to th axis PP' which is a rectangle of dimensions a and b, the dimensions a and b being linked with the cut-off wavelength of the cavity $\lambda_C$ and with m and n by the equation:

$$\left(\frac{m}{2a}\right)^2 + \left(\frac{n}{2b}\right)^2 = \frac{1}{\lambda_C^2}$$

5. An oscillator according to claim 4, wherein it comprises along at least one longitudinal edge of the cavity an attenuating substance (13) protected by a metal mask (14) level with the longitudinal edge of the cavity.

6. An oscillator according to claim 4, comprising a piston making it possible to modify the dimensions of the cavity, said piston forming a wall of said cavity parallel to the axis PP' of the cavity.

7. An oscillator according to claim 6, wherein an attenuating substance is placed in the thickness of the piston.

8. An oscillator according to claim 1 wherein oscillation takes place on the $3\pi$ mode and wherein the distance between two successive coupling orifices is double that between two successive vanes.

9. An oscillator according to claim 1, wherein the cavity is a straight parallelpiped, having a longitudinal axis PP' in parallel with the longitudinal axis of said periodic structure line, and a cross section perpendicular to the axis PP' which is a square of dimensions a and b, the dimensions a and b being linked with th cut-off wavelength of the cavity $\lambda_C$ and with m and n by the equation:

$$\left(\frac{m}{2a}\right)^2 + \left(\frac{n}{2b}\right)^2 = \frac{1}{\lambda_C^2}$$

10. An oscillator according to claim 9, wherein it comprises along at least one longitudinal edge of the cavity an attenuating substance (13) protected by a metal mask (14) level with the longitudinal edge of the cavity.

11. An oscillator according to claim 9, comprising a piston making it possible to modify the dimensions of the cavity, said piston forming a wall of said cavity parallel to the axis PP' of the cavity.

12. An oscillator according to claim 11 wherein an attenuating substance is placed in the thickness of the piston.

13. An oscillator according to claim 1 comprising attenuating substances (13) protected by metal masks (15) located at the ends of the orifices (8) facing the longitudinal edges of the cavity.

* * * * *